United States Patent [19]

Nelson

[11] Patent Number: 5,170,139
[45] Date of Patent: * Dec. 8, 1992

[54] PIN DIODE SWITCH

[75] Inventor: Stephen R. Nelson, Richardson, Tex.

[73] Assignee: Texas Instruments Incorporated, Dallas, Tex.

[*] Notice: The portion of the term of this patent subsequent to Oct. 27, 2009 has been disclaimed.

[21] Appl. No.: 801,330

[22] Filed: Dec. 2, 1991

Related U.S. Application Data

[63] Continuation of Ser. No. 676,649, Mar. 28, 1991.

[51] Int. Cl.[5] .............................................. H01P 1/15
[52] U.S. Cl. .................................... 333/103; 333/104; 437/133
[58] Field of Search ............. 333/103, 104, 164, 81 A, 333/81 B, 247

[56] References Cited

U.S. PATENT DOCUMENTS

| | | | |
|---|---|---|---|
| 3,374,364 | 3/1968 | Concelman | 333/103 X |
| 3,475,700 | 10/1969 | Ertel | 333/104 |
| 3,597,706 | 8/1971 | Kibler | 333/104 |
| 3,982,212 | 9/1976 | Wallington et al. | 333/104 |
| 3,982,267 | 9/1976 | Henry | 357/58 X |
| 4,129,838 | 12/1978 | Wallington et al. | 333/104 |
| 4,322,695 | 3/1982 | Fleming et al. | 333/81 AX |
| 4,630,011 | 12/1986 | Neidert et al. | 333/164 |
| 5,047,829 | 9/1991 | Seymour et al. | 333/247 X |

Primary Examiner—Paul Gensler
Attorney, Agent, or Firm—Dana L. Burton; Richard A. Stoltz; Richard L. Donaldson

[57] ABSTRACT

This is a monolithic PIN diode switch circuit. The switch comprises: input ports, output ports, bias nodes and PIN diodes. Each port or node is connected to receive a bias signal. Preferably the PIN diodes are fabricated from GaAs or other III-V compound. This monolithic PIN diode switch offers broader band performance and smaller size. Other methods and devices are disclosed.

10 Claims, 2 Drawing Sheets

Fig.1

PIN DIODE SWITCH

This is a continuation of application Ser. No. 07/676,649, filed Mar. 28, 1991.

NOTICE TI-15704 1

(C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention relates to semiconductor electronic integrated circuits, and more particularly, to monolithic microwave switches.

BACKGROUND OF THE INVENTION

The PIN diode is a microwave semiconductor diode which can be used as an electrically variable resistor. It can be incorporated in waveguide, coaxial, and stripline components for microwave switching, attenuation, limiting, modulation, and phase shifting. PIN diode switches have been constructed by mounting diodes in series, shunt, or a combination of the two. Historically, hybrid Si PIN diodes have been used in microwave circuits. However, to meet requirement specifications (such as insertion loss), the Si PIN diodes used are extremely small, making them difficult to bond into circuits. The parasitic bond wire inductances used to connect the diodes into the circuit reduce the bandwidth over which the device maintains an acceptable small-signal match. A monolithic device can decrease both the size of the circuit and the parasitic bond wire inductance, however, this has been difficult to achieve in Si.

SUMMARY OF THE INVENTION

This is a monolithic PIN diode switch circuit. The circuit comprises: first and second input ports; first and second output ports; a first pair of back-to-back monolithic GaAs PIN diodes connected between the first input and the first output ports, the first pair of back-to-back monolithic GaAs PIN diodes having a first bias node between the first pair of back-to-back monolithic GaAs PIN diodes; a second pair of back-to-back monolithic GaAs PIN diodes connected between the first input and the second output ports, the second pair of back-to-back monolithic GaAs PIN diodes having a second bias node between the second pair of back-to-back monolithic GaAs PIN diodes; a third pair of back-to-back monolithic GaAs PIN diodes connected between the second input and the first output ports, the third pair of back-to-back monolithic GaAs PIN diodes having a third bias node between the third pair of back-to-back monolithic GaAs PIN diodes; and a fourth pair of back-to-back monolithic GaAs PIN diodes connected between the second input and the second output ports, the fourth pair of back-to-back monolithic GaAs PIN diodes having a fourth bias node between the fourth pair of back-to-back monolithic GaAs PIN diodes; the first and fourth pairs of monolithic GaAs PIN diodes being connected cathode-to-cathode and the second and third pairs of monolithic GaAs PIN diodes being connected anode-to-anode; the first, second, third and fourth bias nodes being connected to receive a first common bias signal; and the first and second input ports and first and second output ports being connected to receive a second common bias signal.

Preferably, the back-to-back PIN diode pairs are directly connected between the input ports and the output ports; the circuit is no greater than one square millimeter in area; the circuit has only two input ports, two output ports, and eight PIN diodes; the PIN diodes are fabricated from GaAs; external bias circuitry is connected through RF decoupling circuits to the input ports, the output ports and the bias nodes; $\lambda/4$ chokes are a portion of the bias circuitry; the PIN diodes are in a square configuration; and the first input port is a transmit port and the second input port is a receive port and the first and second output ports are antenna ports.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Monolithic GaAs PIN diodes have demonstrated superior performance in a number of switching and control circuits. The low on-state resistance and low off-state capacitance of the GaAs PIN diode, coupled with the small physical size of the diode, allow circuit topologies not possible with conventional silicon PIN diodes or with GaAs field effect transistor (FET)-based technology.

Figure 1:
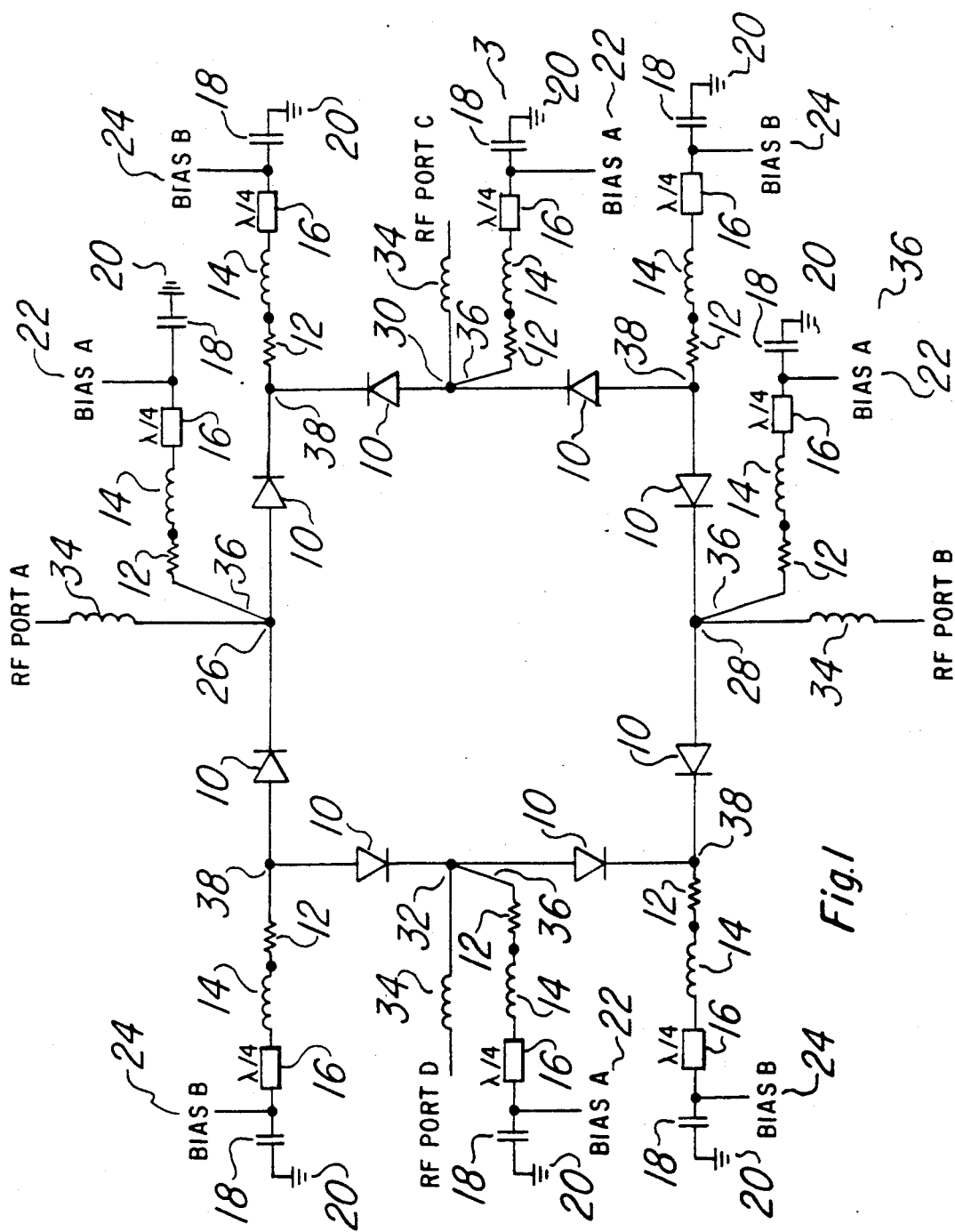
FIG. 1 is a schematic of a preferred embodiment of this invention.

FIG. 1 shows a preferred embodiment PIN diode switch schematic. Table 1 below may be referred to for clarification of the element numbers in the drawing. The switch has four RF Ports 26,28,30,32 and eight DC Ports 36,38. The RF Ports 26,28,30,32 are generically labeled RF Port A–D, however more application specific names could be used. For example, RF Port A 26 could be labeled Antenna 1, RF Port B 28 could be labeled Antenna 2, RF Port C 30 could be labeled Transmit, and RF Port D 32 could be labeled Receive. The switch contains eight PIN diodes 10 in preferably a square or diamond configuration with the diodes connected either anode-to-anode or cathode-to-cathode, oriented as shown in FIG. 1. This method of connection creates a higher breakdown voltage and improved RF power handling. The RF Ports 26,28,30,32 are connected externally by bond wires 34, which will exhibit a parasitic inductance. The DC Ports 36,38 are connected to approximately 250 ohm on-chip resistors 12 to limit diode current. Off-chip each resistor 12 is connected in series to a bond wire 14, which is connected in series to an approximately 80 ohm $\lambda/4$ choke 16 (¼ wavelength line), which is connected in series to a low reactance capacitor 18, which is tied to ground 20. The Bias A 22 and Bias B 24 lines are between the $\lambda/4$ chokes 16 and the capacitors 18 in each of the 8 DC Port lines. The DC Port lines 36, by the RF Ports 26,28,30,32 are connected to Bias A 22 and the DC Port lines 38, between the two diodes 10 in each switch arm (the two diodes between the RF Ports denote a switch arm for a total of four switch arms) are connected to Bias B 24.

If all Bias A lines 22 are set at 1.5-5.0 volts, and all Bias B lines 24 are set at 0 volts or at a negative voltage, the arms between RF Port A 26 and RF Port C 30, and between RF Port B 28 and RF Port D 32 will offer low insertion loss. The diodes 10 in these arms will be biased on; DC current will flow from Bias A 22 to Bias B 24 but RF will be blocked by the λ/4 chokes 16 at the desired operation frequency. The other two paths, RF Port A 26 to RF Port D 32, and RF Port B 28 to RF Port C 30, are biased off when Bias A 22 is 1.5-5.0 volts and Bias B 24 is 0 volts. Switching the two bias voltages ( Bias A 22 is 0 volts and Bias B 24 is 1.5-5.0 volts) switches the low-loss and isolation arms. Therefore RF Port D 32 can be switched to either RF Port A 26 or RF Port B 28, while RF Port C simultaneously would be switched to either RF Port B 28 or RF Port A 26, respectively. RF Ports C 30 and D 32 cannot both be switched to RF Port A 26 or B 28 at the same time. If 0 volts is applied to both Bias A 22 and Bias B 24 all switch arms are "off" (high isolation).

Figure 2A:
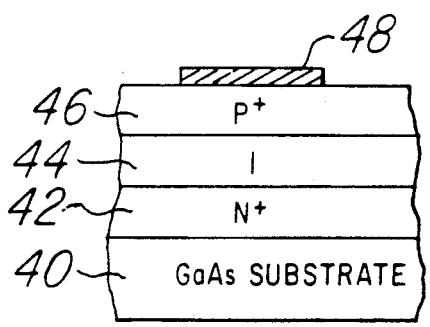
FIG. 2a–2f are cross-sectional views of a preferred method of PIN diode fabrication during sequential processing steps.
Figure 2B:
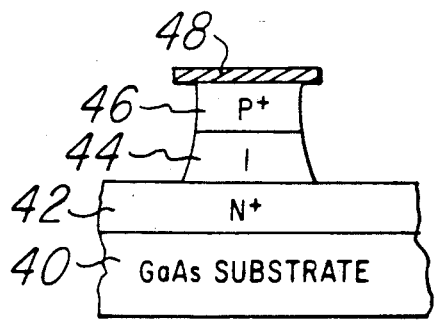
Figure 2C:
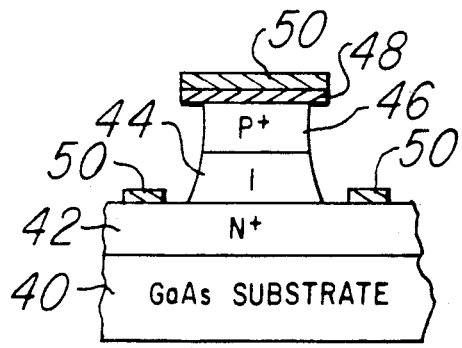
Figure 2D:
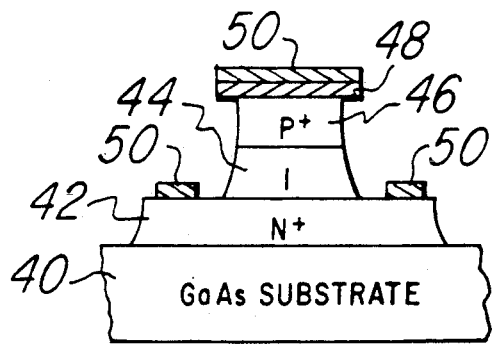
Figure 2E:
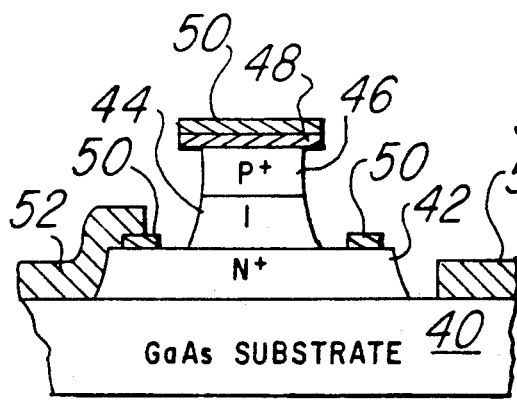
Figure 2F:
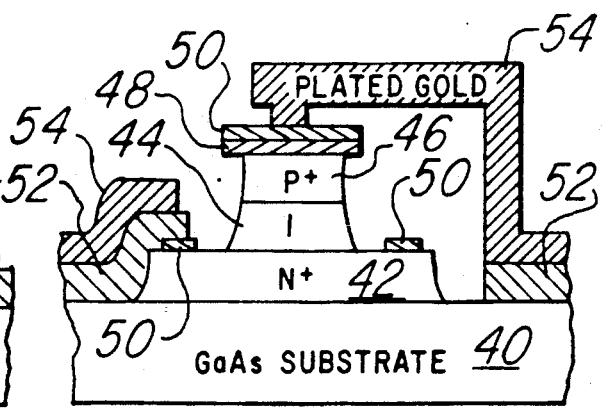

FIGS. 2a-2f show a method for fabrication of a vertical GaAs PIN diode, which is a preferred method for this device. Referring to FIG. 2a, the PIN diodes are formed on an semi-insulating GaAs substrate 40. The layers are preferably epitaxially grown by a metal organic chemical vapor deposition (MOCVD) process. An alternative process would be molecular beam epitaxy (MBE). A n-type layer 42, preferably n+, approximately 0.25 um thick and doped greater than $10$ $cm^{-3}$, is grown over the substrate 40. The n+ layer 46 may be doped with dopants such as Si, S, or Se. An I (intrinsic) layer 44, preferably 1.2 um thick and doped $3 \times 10^{14}$ $cm^{-3}$ or less, is grown over the n+ layer 42. A p-type layer 46, preferably p+, approximately 0.25 um thick and doped greater than $10^{18}$ $cm^{-3}$, is grown over the I layer 44. The p+ layer 46 may be doped with dopants such as Be, Zn, C, Mg, or Mn. A p+ contact layer 48 of Au/Zn/Au is deposited on the p-type layer 46 and patterned for the p+ layer 46 contact. The p+ contact layer 48 is preferably alloyed for 1 minute at 370° C. Referring to FIG. 2b, a mesa for the PIN diode is etched to the I layer 44/n+ layer 42 interface using the p+ contact layer 48 as a mask. In FIG. 2c, a n+ contact layer 50 of Au/Ge/Ni is deposited on the n+ layer 42 and on the p+ contact layer 48, and patterned to form contact to the n+ layer 42. The n+ contact layer 50 is preferably alloyed for 3 minutes at 430° C. The diodes are isolated by etching through the n+ layer, as shown in FIG. 2d. Referring to FIGS. 2e and 2f, after the contact metals 48,50 are alloyed, interconnect metals 52, preferably Ti/Au, are patterned and lifted off. Ti/Au is then deposited, patterned, and plated to form airbridges and transmission lines 54. The number of PIN diodes desired for the circuit may be fabricated in the described manner on a single substrate. This is only one embodiment of PIN diode formation. Any method which results in monolithic PIN diode formation, such as implantation of the p+ and n+ regions, may be used to realize the circuit described above. Also, if desired, the cathode-to-cathode connected diodes could share a common p+ region and the anode-to-anode connected diodes could share a common n+ region.

The resultant integrated circuit may be placed on a thin-film or thick-film substrate along with the external bias circuitry (with RF decoupling circuits) for integration into a system.

The GaAs monolithic PIN diode switch described above offers many advantages. Several GaAs PIN diodes can be integrated on a semi-insulating GaAs substrate, while maintaining high isolation between the diodes and achieving low diode parasitic capacitances. This is very difficult to do in silicon. The diodes are heat sunk by the GaAs substrate. This PIN diode switch offers low insertion loss and high isolation, even better than switches made using GaAs FETs or HBTs. The monolithic implementation of this switch offers broader band performance and much smaller size (less than 1 square millimeter in area) than a hybrid switch. External bias circuitry may be used to tune the switch for operation from less than 100 MHz to frequencies above 2 GHz.

A preferred embodiment has been described in detail hereinabove. It is to be understood that the scope of the invention also comprehends embodiments different from those described, yet within the scope of the claims. For example, the λ/4 chokes could be replaced with inductors or high value resistors. Similarly, instead of GaAs the circuit could be fabricated from other III–V compounds such as InP, and as previously mentioned an MBE growth process could be used in place of the MOCVD process. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| ELEMENT NUMBER | DESCRIPTION |
| --- | --- |
| 10 | PIN DIODES |
| 12 | DC PORT RESISTORS |
| 14 | DC PORT BOND WIRES |
| 16 | λ/4 CHOKES |
| 18 | DC PORT CAPACITORS |
| 20 | GROUND |
| 22 | BIAS A LINES |
| 24 | BIAS B LINES |
| 26 | RF PORT A |
| 28 | RF PORT B |
| 30 | RF PORT C |
| 32 | RF PORT D |
| 34 | RF PORT BOND WIRES |
| 36 | DC PORTS |
| 38 | DC PORTS |
| 40 | SUBSTRATE |
| 42 | N+ LAYER |
| 44 | INTRINSIC LAYER |
| 46 | P+ LAYER |
| 48 | P+ CONTACT LAYER |
| 50 | N+ CONTACT LAYER |
| 52 | INTERCONNECT METAL |
| 54 | PLATED METAL AIR BRIDGE & TRANSMISSION LINES |

What is claimed is:

1. A monolithic PIN diode switch circuit comprising:
   a. first and second input ports;
   b. first and second output ports;
   c. a first pair of back-to-back PIN diodes connected between said first input and said first output ports, said first pair of back-to-back PIN diodes having a first bias node between said first pair of back-to-back diodes;
d. a second pair of back-to-back PIN diodes connected between said first input and said second output ports, said second pair of back-to-back PIN diodes having a second bias node between said second pair of back-to-back PIN diodes;
e. a third pair of back-to-back PIN diodes connected between said second input and said first output ports, said third pair of back-to-back PIN diodes having a third bias node between said third pair of back-to-back PIN diodes; and
f. a fourth pair of back-to-back PIN diodes connected between said second input and said second output ports, said fourth pair of back-to-back PIN diodes having a fourth bias node between said fourth pair of back-to-back PIN diodes.

2. The circuit of claim 1, wherein said back-to-back PIN diode pairs are directly connected between said input ports and said output ports.

3. The circuit of claim 1, wherein said circuit is no greater than one square millimeter in area.

4. The circuit of claim 1, wherein said circuit has only two input ports, two output ports, and eight PIN diodes.

5. The circuit of claim 1, wherein said PIN diodes are fabricated from GaAs.

6. The circuit of claim 1, wherein external bias circuitry is connected through RF decoupling circuits to said input ports, said output ports and said bias nodes.

7. The circuit of claim 6, wherein $\lambda/4$ chokes are a portion of said bias circuitry.

8. The circuit of claim 1, wherein said PIN diodes are in a square configuration.

9. The circuit of claim 1, wherein said first input port is a transmit port and said second input port is a receive port and said first and second output ports are antenna ports.

10. The circuit of claim 1, wherein said PIN diodes comprise a III–V compound.

* * * * *